United States Patent
Acharya et al.

(10) Patent No.: US 12,504,147 B2
(45) Date of Patent: Dec. 23, 2025

(54) LIGHTING ELECTRONICS COOLING USING HIGH TEMP TEC WITH INTEGRATED HEAT SINK

(71) Applicant: Goodrich Lighting Systems, Inc., Phoenix, AZ (US)

(72) Inventors: Pradeep Acharya, Bangalore (IN); Sreekanth Rao, Bangalore (IN); Abhilash Krishna, Bangalore (IN); Anand Nanjundappa, Bangalore (IN)

(73) Assignee: GOODRICH LIGHTING SYSTEMS, INC., Phoenix, AZ (US)

( * ) Notice: Subject to any disclaimer, the term of this patent is extended or adjusted under 35 U.S.C. 154(b) by 407 days.

(21) Appl. No.: 17/940,729

(22) Filed: Sep. 8, 2022

(65) Prior Publication Data
US 2023/0408059 A1 Dec. 21, 2023

(30) Foreign Application Priority Data
Jun. 15, 2022 (IN) .............................. 202241034195

(51) Int. Cl.
*F21V 29/54* (2015.01)
*B64D 47/06* (2006.01)
(Continued)

(52) U.S. Cl.
CPC .............. *F21S 45/47* (2018.01); *B64D 47/06* (2013.01); *F21V 29/54* (2015.01);
(Continued)

(58) Field of Classification Search
CPC . F21S 45/47; F21S 45/48; F21S 45/49; F21V 29/54; F21V 29/10; F21V 29/15; F21V 29/00; F21V 29/75; F21V 29/713; F21V 29/763; B01L 2300/1822; B29C 2035/1608; H10N 10/10; H10N 10/13; H10N 10/17; H10N 10/817; H10N 10/81;
(Continued)

(56) References Cited

U.S. PATENT DOCUMENTS 7,095,187 B2   8/2006   Young
8,596,845 B2   12/2013  Burton et al.
(Continued)

FOREIGN PATENT DOCUMENTS

EP   2572992   7/2014
EP   3808663   4/2021

OTHER PUBLICATIONS

European Patent Office, European Search Report dated Jan. 26, 2024 in Application No. 23177393.8.
(Continued)

*Primary Examiner* — Omar Rojas Cadima
(74) *Attorney, Agent, or Firm* — SNELL & WILMER L.L.P.

(57) ABSTRACT

An aircraft light unit is disclosed herein. The aircraft light unit includes a housing having a first side and an opposing second side, a light coupled to the first side of the housing, a circuit board assembly coupled to second side of the housing, a thermoelectric cooler coupled to the circuit board assembly and configured to dissipated heat from the circuit board assembly, and a heat sink disposed over the thermoelectric cooler and configured to dissipate heat from the thermoelectric cooler.

8 Claims, 8 Drawing Sheets

(51) Int. Cl.
   *F21S 45/47*        (2018.01)
   *G05B 19/4155*      (2006.01)
   *F21W 107/30*       (2018.01)

(52) U.S. Cl.
   CPC ..... *G05B 19/4155* (2013.01); *F21W 2107/30* (2018.01); *G05B 2219/50333* (2013.01)

(58) Field of Classification Search
   CPC ........ H10N 10/82; H10N 10/85; F25B 21/02; F21W 2111/06; F21W 2102/00; F21W 2111/00; F21W 2111/02; B64D 2203/00; B64D 47/04
   See application file for complete search history.

(56) References Cited

U.S. PATENT DOCUMENTS

| | | | |
|---|---|---|---|
| 9,881,466 B2 | 1/2018 | Zarnowski et al. | |
| 2008/0295522 A1* | 12/2008 | Hubbell | F21S 45/47 62/3.2 |
| 2010/0033689 A1 | 2/2010 | Overmann et al. | |
| 2010/0084979 A1 | 4/2010 | Burton et al. | |
| 2018/0159354 A1* | 6/2018 | Garcia-Marquez | H02J 7/35 |

OTHER PUBLICATIONS

European Patent Office, European Partial Search Report dated Nov. 6, 2023 in Application No. 23179304.3.
European Patent Office, European Office Action dated Sep. 22, 2025 in Application No. 23179304.3.

\* cited by examiner

LIGHTING ELECTRONICS COOLING USING HIGH TEMP TEC WITH INTEGRATED HEAT SINK

CROSS-REFERENCE TO RELATED APPLICATIONS

This application claims priority to, and the benefit of, India Provisional Patent Application No. 202241034195, filed Jun. 15, 2022 (DAS Code B8A5) and titled "LIGHTING ELECTRONICS COOLING USING HIGH TEMP TEC WITH INTEGRATED HEAT SINK," which is incorporated by reference herein in its entirety for all purposes.

FIELD

The present disclosure generally relates light units, and more specifically, to cooling light units.

BACKGROUND

In some aircraft, the taillight is mounted near the auxiliary power unit (APU) exhaust. During operation, the light unit, including all components within the light unit, is exposed to hot air output from the APU. After prolonged exposure to hot air, the circuit board assembly (CBA) within the light unit may have performance degradation. Current light cooling systems may be improved to improve the life span of the taillight.

SUMMARY

An aircraft light unit is disclosed herein. The aircraft light unit includes a housing having a first side and an opposing second side, a light coupled to the first side of the housing, a circuit board assembly coupled to second side of the housing, a thermoelectric cooler coupled to the circuit board assembly and configured to dissipated heat from the circuit board assembly, and a heat sink disposed over the thermoelectric cooler and configured to dissipate heat from the thermoelectric cooler.

In various embodiments, the aircraft light unit further includes a spacer having a top surface and a bottom surface, the bottom surface coupled to the circuit board assembly, and the top surface coupled to the thermoelectric cooler. In various embodiments, the spacer is made from aluminum or an aluminum alloy. In various embodiments, the aircraft light unit further includes an insulator coupled to the top surface of the spacer and adjacent the thermoelectric cooler, the insulator is made of ceramic wool. In various embodiments, the insulator is made of at least one of wool, ceramic, and a composite material. In various embodiments, the thermoelectric cooler further comprises a cold side and an opposing hot side, the cold side physically contacting the top surface of the spacer.

In various embodiments, the heat sink further comprises a plurality of fins extending toward the first side of the housing. In various embodiments, the one or more openings are disposed between the first side and the second side of the housing. In various embodiments, the fins of the heat sink extend partially into the one or more openings. In various embodiments, the heat sink physically contacts the thermoelectric cooler.

Also disclosed herein is a light unit. The light unit includes a circuit board assembly, a temperature sensor connected to the circuit board assembly, a thermoelectric cooler coupled to the spacer, a processor, and a memory coupled to the processor. The memory includes instructions that when executed by the processor cause the processor to receive a first temperature reading from the temperature sensor, the temperature reading providing an indication of the temperature of the circuit board assembly, activate the thermoelectric cooler in response to the first temperature reading exceeding an operation temperature threshold, receive a second temperature reading from the temperature sensor, the second temperature reading providing a second indication of the temperature of the circuit board assembly, and deactivating the thermoelectric cooler in response to the second temperature reading being below the operation temperature threshold.

In various embodiments, the light unit further includes a heat sink coupled to the thermoelectric cooler, the heat sink physically contacting the thermoelectric cooler. In various embodiments, the light unit further includes a spacer coupled to the circuit board assembly and disposed between the circuit board assembly and the thermoelectric cooler, wherein the heat sink is disposed over the spacer.

In various embodiments, the instructions when executed by the processor further cause the processor to determine that the first temperature exceeds an activate temperature threshold that is lower than the operation temperature threshold and activate the thermoelectric cooler in response to the first temperature exceeding the activate temperature threshold. In various embodiments, the instructions when executed by the processor further cause the processor to determine that the second temperature exceeds a deactivate temperature threshold that is higher than the activate temperature threshold and deactivated the thermoelectric cooler in response to the second temperature being below the deactivate temperature threshold.

Also disclosed herein is a cooling stack for a circuit board assembly. The cooling stack includes a spacer disposed over the circuit board assembly, a thermoelectric cooler disposed over the spacer, an insulator disposed over the spacer and adjacent the thermoelectric cooler, and a heat sink disposed over the thermoelectric cooler, the heat sink having a plurality of fins extending away from the thermoelectric cooler.

In various embodiments, the spacer has a top surface and an opposing bottom surface, the opposing bottom surface physically contacting the circuit board assembly. In various embodiments, the thermoelectric cooler has a cold side and an opposing hot side, the cold side physically contacting the top surface of the spacer. In various embodiments, the heat sink physically contacts the thermoelectric cooler. In various embodiments, the insulator includes ceramic wool.

The foregoing features and elements may be combined in any combination, without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

DETAILED DESCRIPTION

The following detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an" or "the" may include one or more than one and that reference to an item in the singular may also include the item in the plural. Further, all ranges may include upper and lower values and all ranges and ratio limits disclosed herein may be combined.

Aircraft generally include multiple light units where each light unit has one or more functions. For example, light units are used for taxiing, take off, landing, wing inspection, navigation, anti-collision beacons, and decoration, among other uses. Light units on the wings and tail of an aircraft provide an indication of a direction that the aircraft is moving. On some aircraft the light units are subjected to high temperatures over prolonged periods of time. Generally, the light units may be thermally cooled by the cold air at high altitude while flying. However, in some cases, such as a taillight installed next to an auxiliary power unit (APU) exhaust, the light unit may be subjected to constant high temperatures which may cause premature failure resulting in increased costs to repair or replace the light unit.

For example, the temperature around a taillight unit next to an APU exhaust may be about 320° C. (608° F.). Prolonged exposure to high temperatures may cause heat accumulation in the light unit and its components. For example, the circuit board assembly (CBA) of the light unit may degrade over time after repeated and prolonged exposure to high temperatures. This degrades the performance of the light unit, even causing the light unit to fail. Disclosed herein is a novel light unit assembly for dissipating heat in the light unit and reducing heat accumulation in the CBA and the light unit overall.

To improve heat dissipation a thermoelectric cooler (TEC) is connected to the CBA. The TEC provides active cooling for the CBA. The TEC includes a hot side and a cold side and uses the temperature differential between the hot side and the cold side to provide active cooling on the cold side. That is, the TEC draws heat from the cold side and transfers the heat to the hot side, effectively cooling the cold side. The cold side is connected to the CBA and the hot side is oriented away from the CBA. A heat sink is connected to the hot side of the TEC. The TEC actively cools the CBA by moving heat from the cold side to the hot side. The heat sink dissipates the heat from the hot side of the TEC. In addition, or in the alternative, a blower may be used to improve the dissipation of the heat from the hot side of the TEC.

As disclosed herein, this cooling configuration cools the light unit, and more specifically, the CBA to less than 120° C. (248° F.), prolonging the life span of the light unit. That is, heat is removed from the CBA by this cooling configuration. The performance of the light unit may be enhanced when operating at 120° C. (248° F.) as opposed to operating at up to 320° C. (608° F.). This cooling does not use chemicals such as chlorofluorocarbon (CFC) which are common in cooling applications. No moving parts are used to achieve the desired cooling, although the optional fan may further improve the cooling of the light unit. Furthermore, this is a low maintenance and zero noise solution that can operate in high temperature and high vibration environments.

Figure 1:
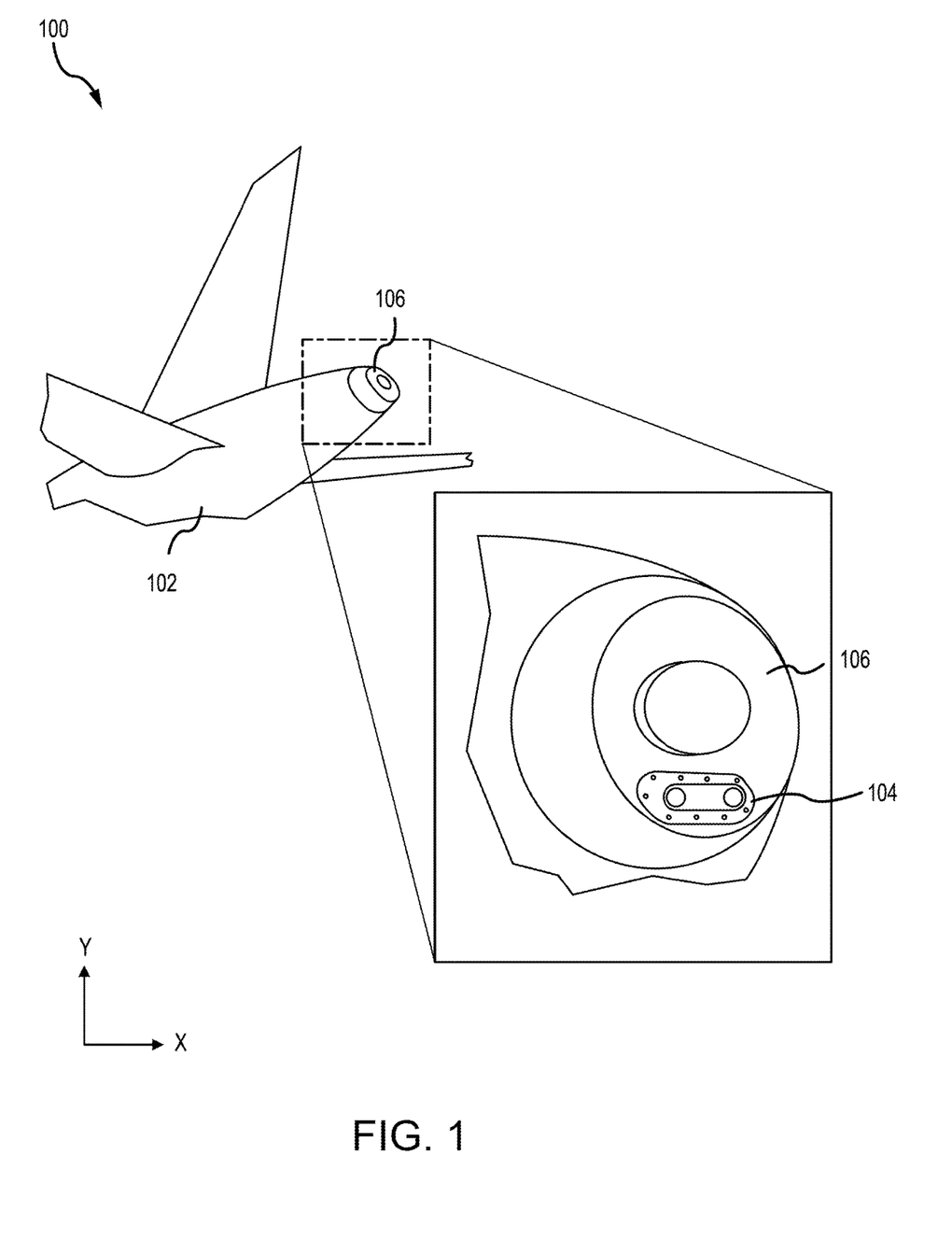
FIG. 1 illustrates an aircraft tail section including a light unit, in accordance with various embodiments.

Referring now to FIG. 1, in accordance with various embodiments, an aircraft 100 tail section 102 including a light unit 104 is illustrated. Light unit 104 may be a taillight. In various embodiments, light unit 104 may be installed on other locations of aircraft 100. In various embodiments, light unit 104 may be installed in other locations that are subjected to high temperatures and/or high vibration. Tail section 102 includes an auxiliary power unit (APU) exhaust 106. Light unit 104 is mounted on tail section 102 and below APU exhaust 106. During operation, the temperature from APU exhaust 106 may be up to 320° C. (608° F.). Generally, most of the heat from APU exhaust 106 blows over light unit 104 raising the temperature of light unit 104, and its associated components, over the operating temperature threshold of 120° C. (248° F.). The exposure may last for the duration of a flight which may be many hours. Over time, repeated exposure to prolonged high temperatures degrades the components of light unit 104 and the performance of light unit 104. The degraded performance can cause failure of light unit 104. Light unit 104 is then replaced which increases costs for parts, labor, and aircraft 100 downtime.

Figure 2:
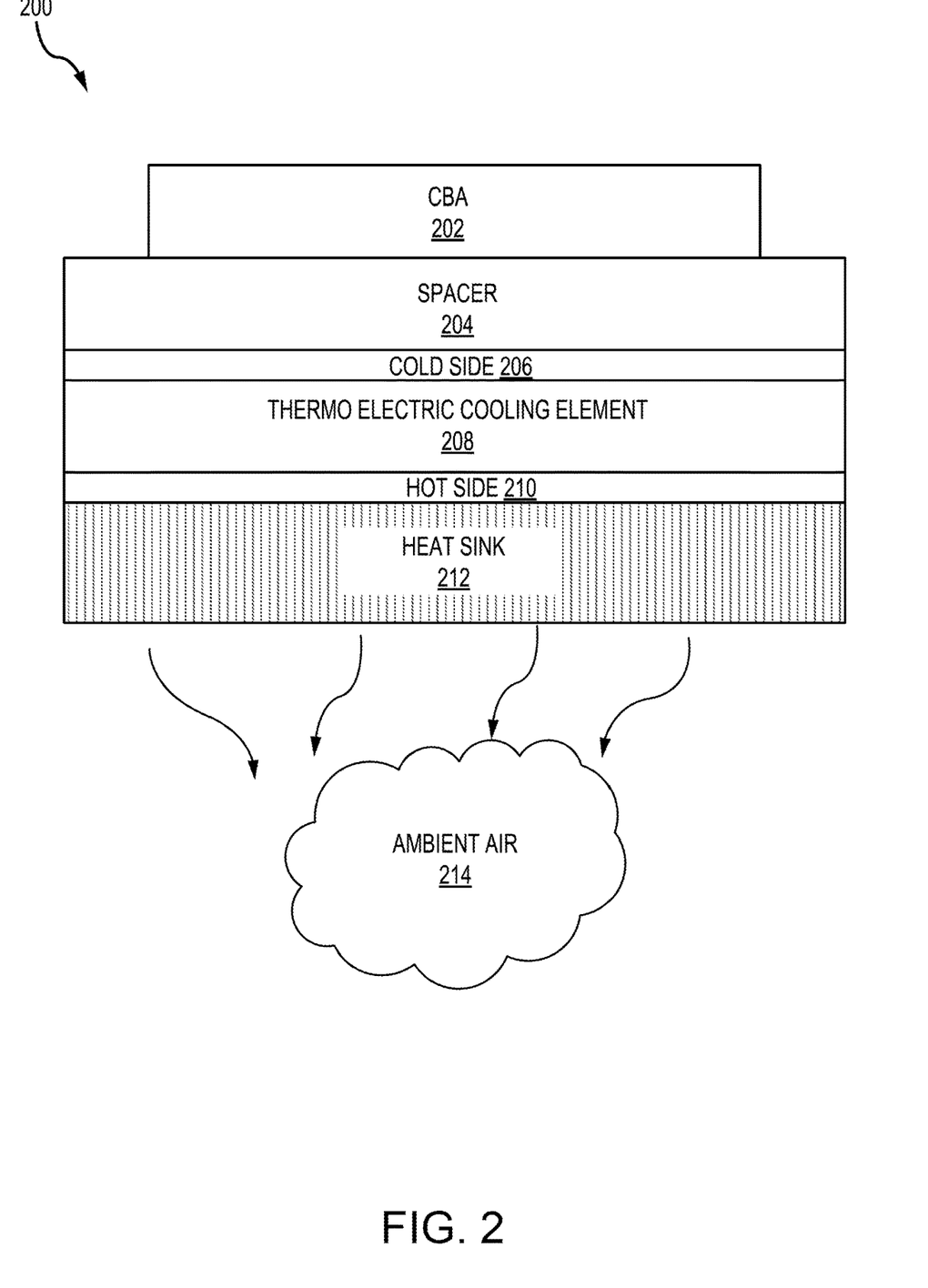
FIG. 2 illustrates a schematic of a cooling stack, in accordance with various embodiments.

Referring now to FIG. 2, in accordance with various embodiments, a schematic diagram 200 of material stack for cooling light unit 104 is illustrated. Schematic diagram 200 includes a circuit board assembly (CBA) 202, a spacer 204, a thermoelectric cooling (TEC) element 208 including a cold side 206 and a hot side 210, and a heat sink 212 exposed to ambient air 214. CBA 202 includes components and circuitry for controlling light unit 104 including turning on and off, among other functions.

Spacer 204 may be made from aluminum or an aluminum alloy. In various embodiments, spacer 204 may be made from other conducting materials such as copper and steel, or any other material that has a high heat transfer capacity Spacer 204 acts as a standoff between TEC 208 and CBA 202, providing separation between TEC 208 and CBA 202. Accordingly, spacer 204 provides a path for thermal conduction from CBA 202 to cold side 206 of TEC 208. As will be shown further below, in various embodiments TEC 208 may be smaller than CBA 202 and spacer 204. Accordingly, spacer 204 provides a conductive heat path from CBA 202 to TEC 208 to extract heat from and provide cooling to CBA 202. In so doing, spacer 204 further protects CBA 202 from heat accumulation by placing hot side 210 of TEC 208 further away from CBA 202 than if TEC 208 were connected directly to CBA 202. TEC 208 is a solid-state active heat pump that uses the Peltier effect to transfer heat from one side of the TEC 208 (e.g., cold side 206) to the other side of the device (e.g., hot side 210). TEC 208 transfers heat from cold side 206 to hot side 210 in response to an electric current flow (e.g., DC electric current flow).

Heat sink 212 may be made from aluminum or aluminum alloy. In various embodiments, spacer 204 may be made from other conducting materials such as copper and steel, among others. Heat sink 212 may include a solid base coupled to TEC 208 with a plurality of fins extending from the solid base and away from TEC 208 to dissipate heat from TEC 208, and more specifically, from hot side 210 of TEC 208. The heat may be dissipated into and by ambient air 214 by heat sink 212 acting as a passive heat sink. During flight, ambient air 214 flows past aircraft 100 and light unit 104. Ambient air 214 may dissipate heat from heat sink 212 as it passes through the fins of heat sink 212. This is more effective at cruising altitudes as ambient air 214 is much colder at cruising altitudes than on or near the ground. As disclosed herein, this configuration is able to remove heat, or energy, at a rate of about 150 J/s to about 200 J/s, depending on the ambient air temperature.

In addition, or in the alternative, heat sink 212 may be an active heat sink. That is, light unit 104 may further include a blower that forces air over, across, and through heat sink 212 to provide active cooling of heat sink 212. This may improve the cooling performance of heat sink 212 in warmer conditions and environments.

Figure 3A:
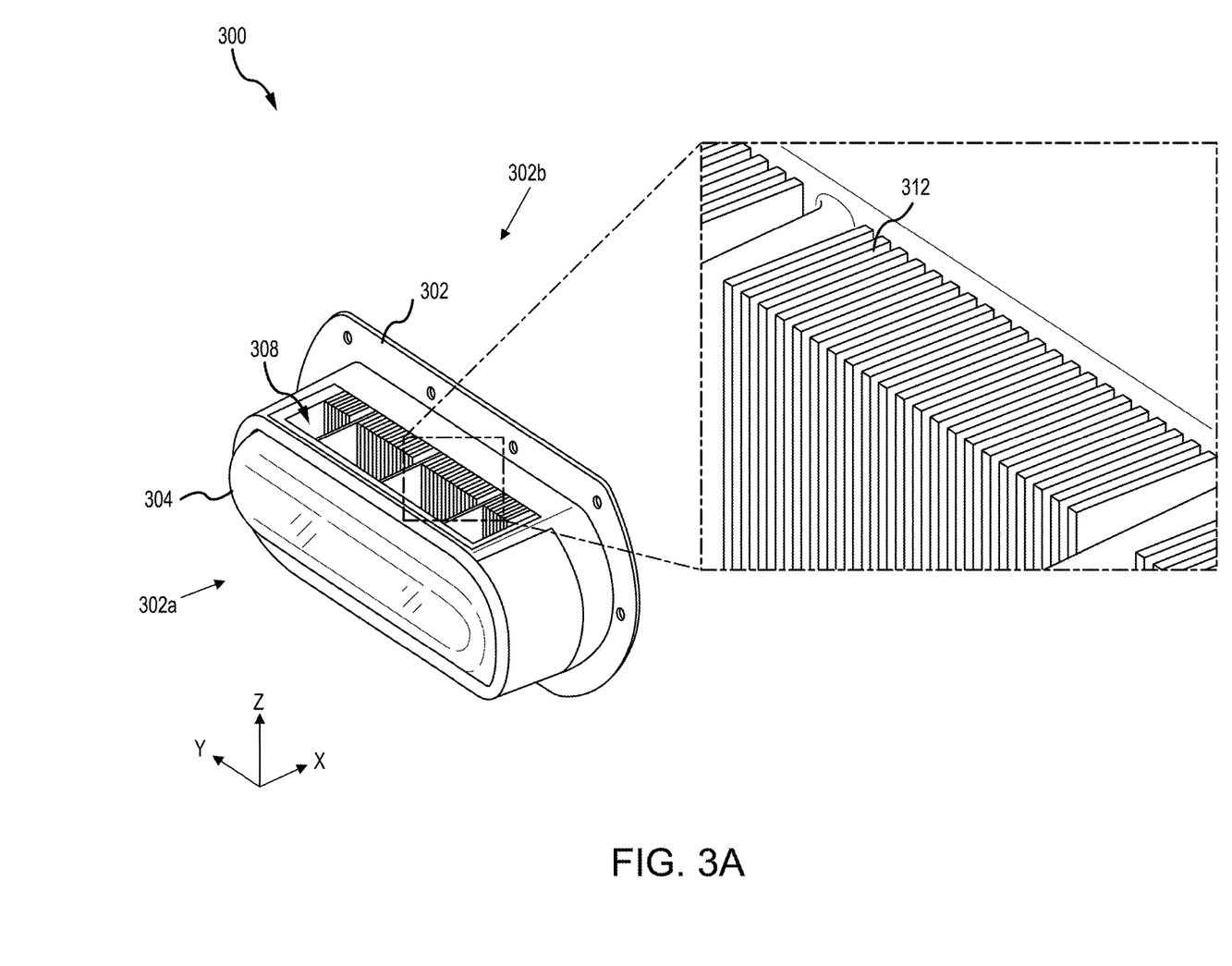
FIGS. 3A, 3B, 3C, and 3D illustrate a light unit including a cooling stack, in accordance with various embodiments.
Figure 3B:
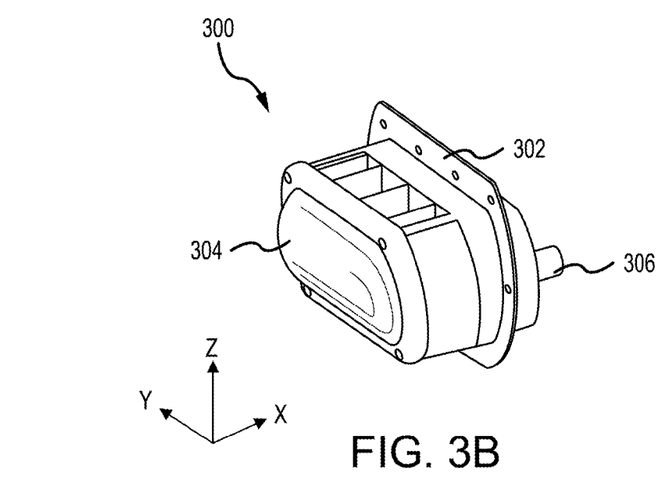
Figure 3C:
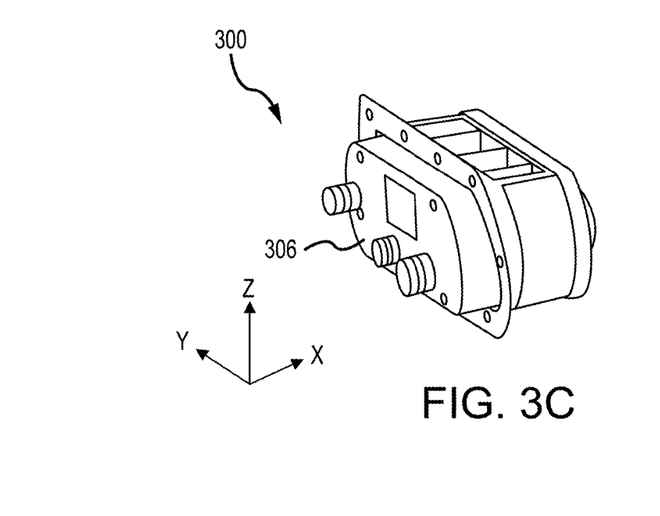
Figure 3D:
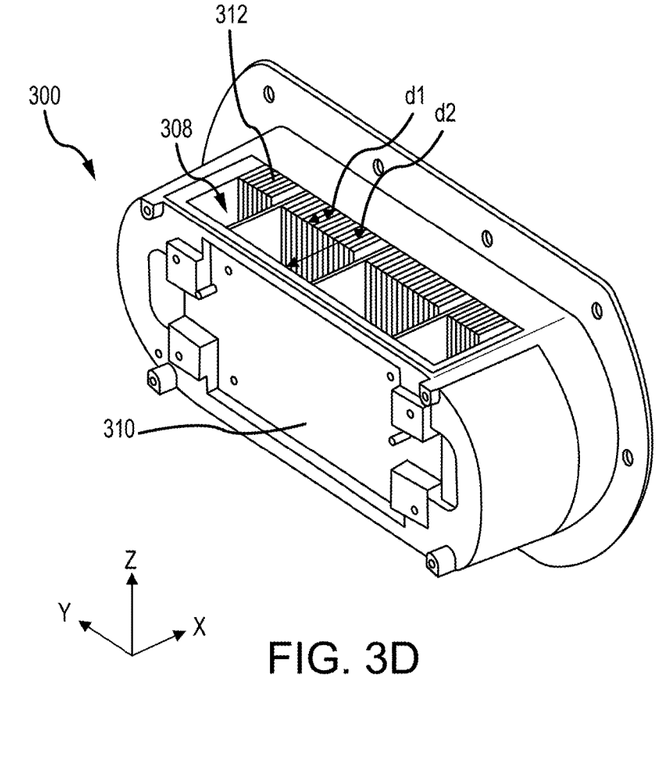

Referring now to FIGS. 3A-3D, in accordance with various embodiments, a light unit 300 including a cooling material stack (e.g., schematic diagram 200), is illustrated. Light unit 300 includes a housing 302, a light 304, and a circuit board assembly (CBA) 306. Housing 302 is mounted to aircraft 100 having a front side 302a (e.g., the x-direction) and a back side 302b (e.g., the negative x-direction), as illustrated in FIG. 3A. Light 304 is connected to front side 302a of housing 302 and is oriented to face away from aircraft 100 when light unit 300 is mounted to aircraft 100. CBA 306 is connected to back side 302b of housing 302 and is protected by housing 302 and aircraft 100 when light unit 300 is mounted to aircraft 100.

Housing may be made from aluminum or aluminum alloy. In various embodiments, spacer 204 may be made from other conducting materials such as copper and steel, among others. Housing 302 further includes openings 308 and light mount 310. Openings 308 are between light mount 310 and CBA 306 (e.g., in the x-axis) and extend a length of housing 302 (e.g., in the y-axis). Openings 308 are sized to allow heat sink 312 to extend into openings 308. Light mount 310 may be solid, as illustrated, and act as a passive heat sink for light 304. In various embodiments, light mount 310 may include openings allowing heat from light 304 to dissipate into openings 308 and thereby cool light 304.

Heat sink 312 is coupled to CBA 306 as described above with respect to FIG. 2. Heat sink 312 provides passive cooling for CBA 306, extending from CBA 306 out into openings 308. This allows air (e.g., ambient air 214) to passively cool heat sink 312. In addition, or in the alternative, a blower, or fan, may be coupled to housing 302 or mounted adjacent housing 302 on aircraft 100 to provide additional airflow over heat sink 312.

Heat sink 312 extends a depth d1 into openings 308 (e.g., in the x-axis). Openings 308 have a depth d1 (e.g., in the x-axis) allowing air flow between light 304, and more specifically, light mount 310 and CBA 306, and more specifically heat sink 312. Depth d2 may be about 1.5 times to about 5 times depth d1, and more specifically, about 2 times to about 3 times depth d1. That is, depth d2 of openings 308 may be a specific multiple of depth d1 that heat sink 312 extends into openings 308. The difference between depth d1 and depth d2 improves airflow, and therefore cooling, across heat sink 312. If heat sink 312 extends across openings 308 such that depth d1 was equal to depth d2, the airflow across heat sink 312 may be significantly reduced. The reduction in airflow would reduce the efficiency of heat sink 312 and may not lower the temperature of CBA 306 sufficiently to avoid the effects of heat accumulations. If the difference between depth d1 and depth d2 is too large (i.e., greater than 5 times difference), there is no additional cooling benefit for CBA 306. That is, there is little to no improvement in cooling.

Figure 4A:
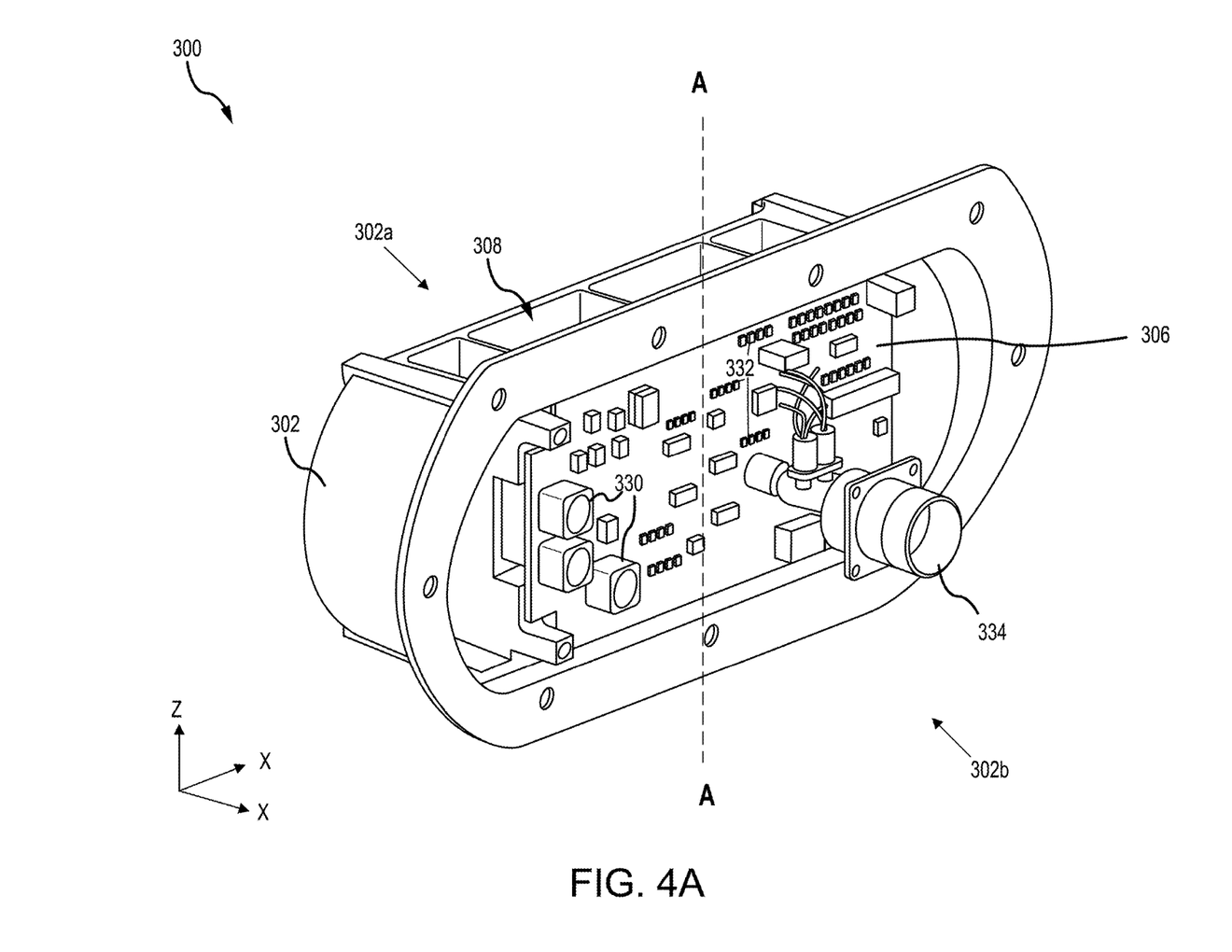
FIGS. 4A, 4B, and 4C illustrate a light unit including a cooling stack, in accordance with various embodiments.
Figure 4B:
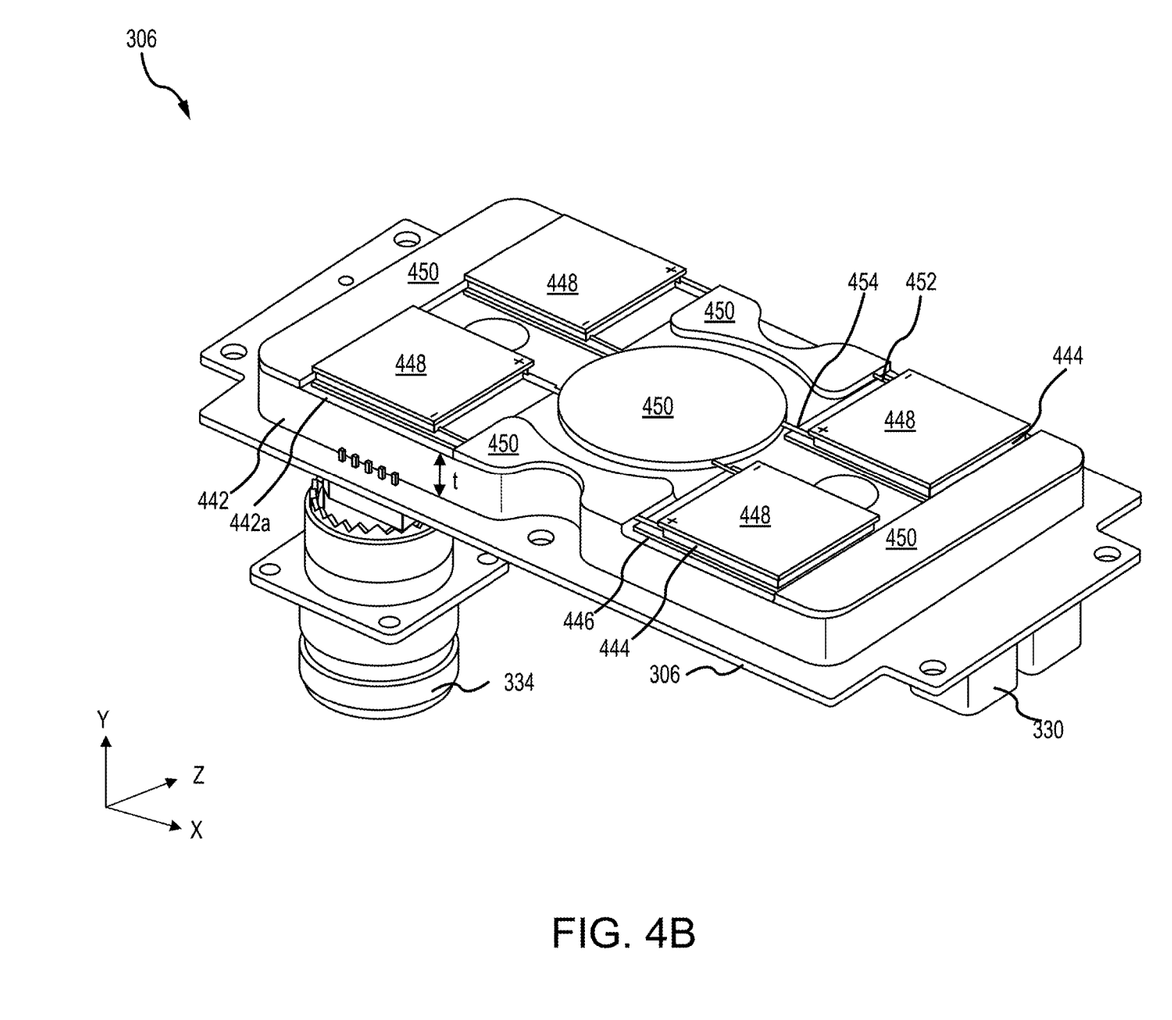
Figure 4C:
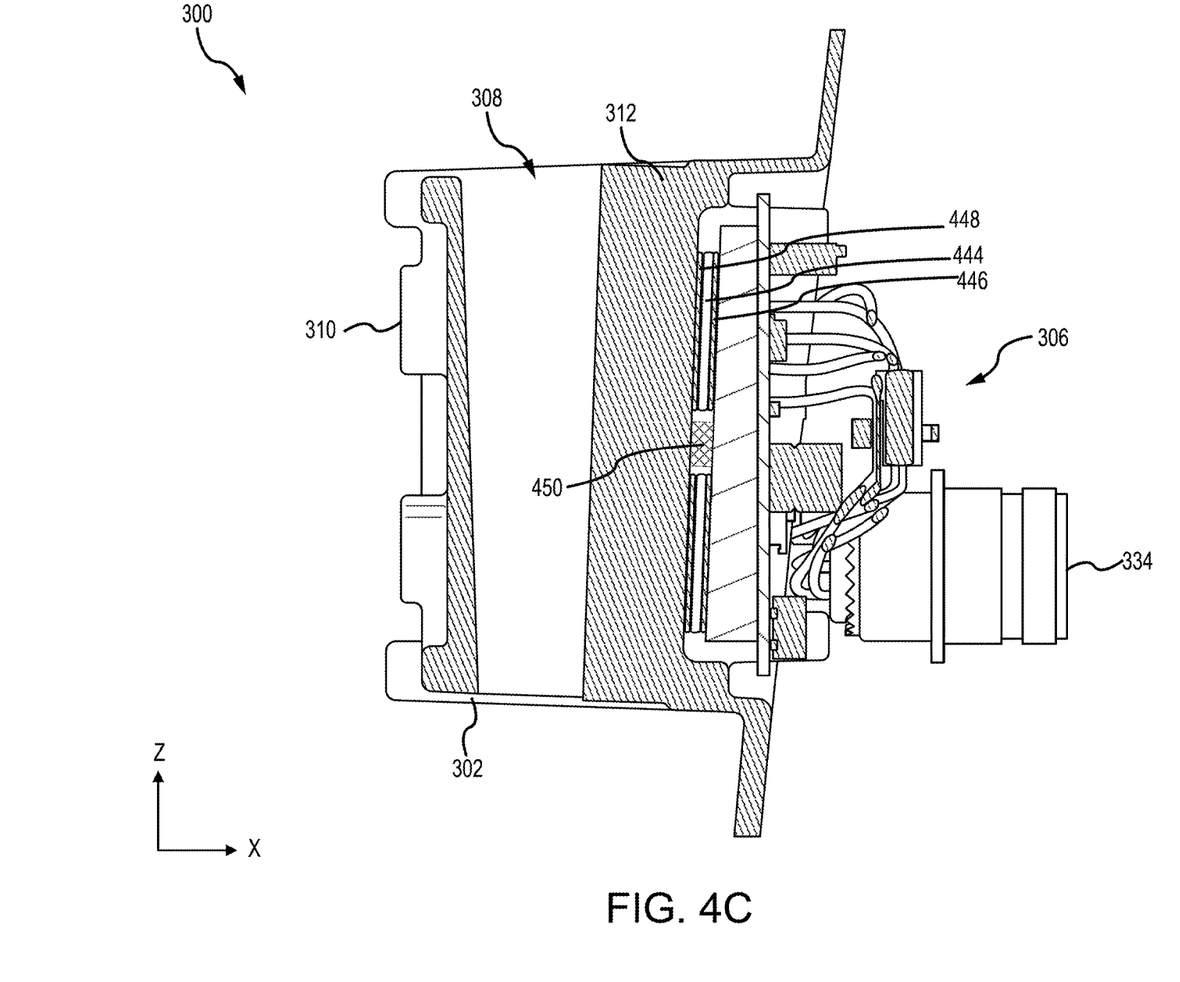

Referring now to FIGS. 4A-C, in accordance with various embodiments, light unit 300 including circuit board assembly (CBA) 306 is illustrated in more detail. FIG. 4A is a perspective view of CBA 306 in housing 302 from back side 302b of housing 302 (e.g., the x-direction). FIG. 4B is a perspective view of CBA 306 including the stack of materials described above with respect to schematic diagram 200 and FIG. 2. FIG. 4C is a cross section view of light unit 300 through line A-A of FIG. 4A.

CBA 306 includes various components 330 and circuitry 332 including a power connector 334 extending away from housing 302 (e.g., the x-direction). CBA 306 provides power and control for light 304 of light unit 300. Power is received through power connector 334 and, runs through components 330 and circuitry 332, among others, and to light 304. As power runs through CBA 306 heat is generated. Generally, CBA 306 operates below 120° C. (248° F.), however when mounted on aircraft 100 near a heat source (e.g., APU exhaust 106) CBA 306 may withstand higher temperatures. For example, CBA 306 may be exposed to temperatures up to 320° C. (608° F.) or higher. Performance of CBA 306 may degrade over time being exposed to such high temperatures. This may be referred to as heat accumulation. Component 330 and circuitry 332 may break down under the high operating temperatures and light unit 300 may fail. Failure of light unit 300 results in additional costs in time, money, and equipment. Aircraft 100 will be pulled from service where technicians will replace light unit 300. This additional cost in downed aircraft time, labor, and parts may be cumulative over the lifetime of aircraft 100 and across a fleet of aircraft.

A cooling stack 440 is connected to CBA 306. Cooling stack 440 includes a spacer 442, one or more thermoelectric cooling (TEC) elements 444 each having a cold side 446 and a hot side 448, and an insulator 450. Cooling stack 440 further includes a heat sink, as described above, but which is not shown in FIG. 4B for clarity of the other layers (e.g., spacer 442, TEC 444, insulator 450, etc.) The heat sink (e.g., heat sink 212, 312) is coupled to hot side 448 of TEC 444 and may have the same footprint as spacer 442.

Spacer 442 may be made from aluminum or an aluminum alloy. In various embodiments, spacer 204 may be made from other conducting materials such as copper and steel, among others. Spacer 204 acts as a standoff between TEC 444 and CBA 306, providing separation between TEC 444 and CBA 306. Furthermore, spacer 442 provides a path for thermal conduction from CBA 306 to cold side 446 of TEC 444. In the depicted embodiment, there are four TEC 444 units connected to a top surface 442a of spacer 442 (e.g., the y-direction) that do not cover the footprint of spacer 442. The conductivity of spacer 442 allows heat to dissipate from CBA 306, thereby lowering the operating temperature of CBA 306, through spacer 402 to where TEC 444 units are placed. Furthermore, spacer 442 provides protection from hot side 448 of TEC 444 units. Spacer has a thickness t that is about 1 cm (0.4 inches) to about 12 cm (4.7 inches), and more specifically, about 3 cm (1.2 inches) to about 10 cm (3.9 inches).

One or more TEC 444 units are coupled to top surface 442a of spacer 442. Each TEC 444 has a cold side 446 and a hot side 448 with TEC 444 between cold side 446 and hot side 448. Cold side 446 is coupled to top surface 442a of spacer 442 to draw heat from spacer 442, lowering the temperature of spacer 442. TEC 444 draws heat from cold side 446 and moves the heat to hot side 448. Heat sink 312 is coupled to hot side 448 to dissipate the heat from hot side 448 (e.g., ambient air 214 blowing over heat sink 312). Heat from cold side 446 is pumped by TEC 444 to hot side 448 in response to receiving power. TEC 444 further includes positive lead 452 and negative lead 454 to receive power for operation. In various embodiments, power is received through CBA 306 from power connector 334.

Insulator 450 is coupled to top surface 442a of spacer 442. Insulator 450 may be made from ceramic, wool, or a composite material, among others. Insulator 450 provides electrical and thermal isolation between cold side 446 and hot side 448 of TEC 444. Insulator 450 further provides thermal isolation between top surface 442a of spacer 442 and heat sink 312 so that heat is not recirculated between heat sink 312 and spacer 442, further reducing heat accumulation on CBA 306 and thereby lowering the operating temperature of CBA 306.

Cooling stack 440 therefore efficiently prevents heat accumulation on CBA 306 without using refrigerant chemicals such as CFCs. Furthermore, cooling stack 440 reduces light unit 300 failures by reducing and/or preventing heat accumulation on CBA 306. Cooling stack 440 operates quietly and without the need for moving parts in high temperature and high vibration environments.

Figure 5:
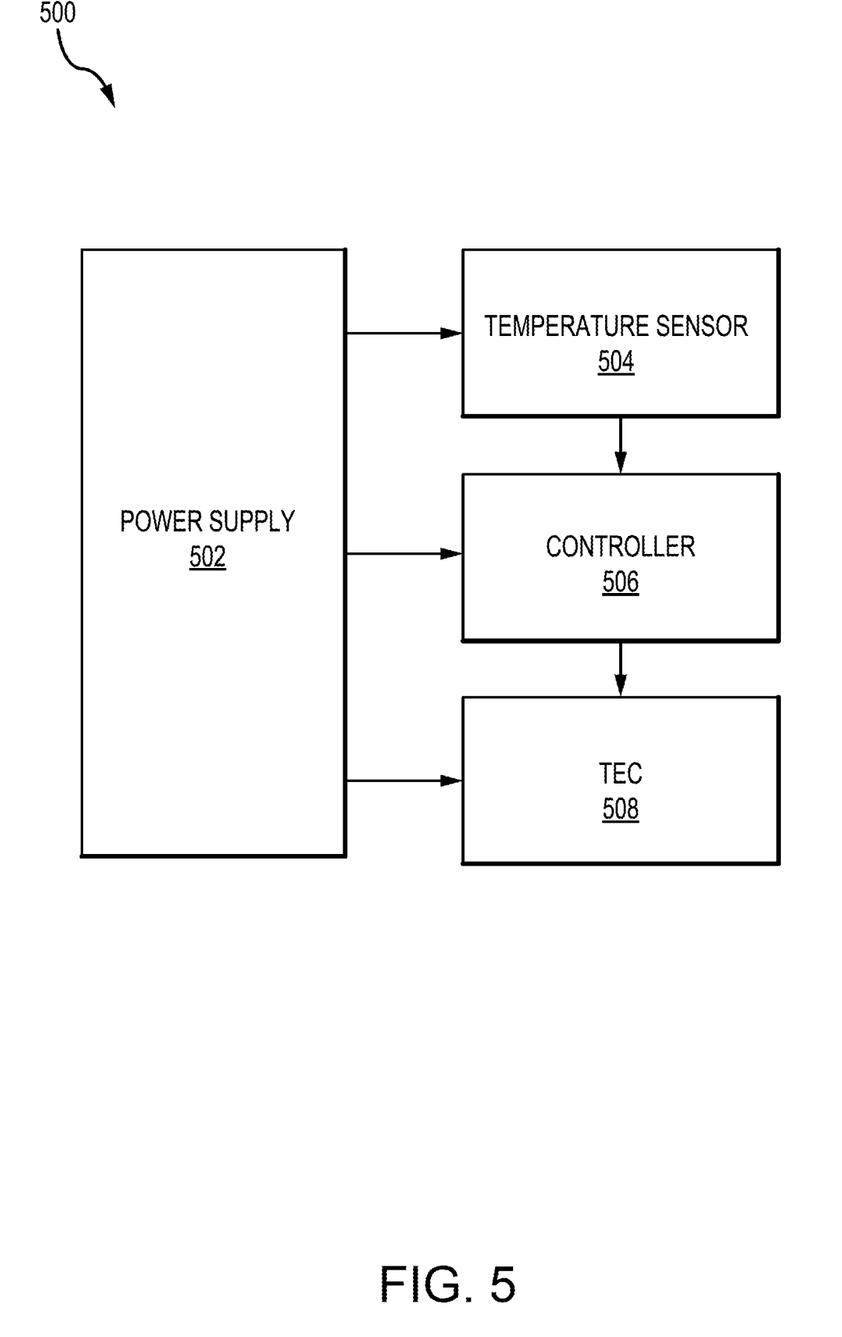
FIG. 5 illustrates a schematic for operating a cooling stack, in accordance with various embodiments.

Referring now to FIG. 5, in accordance with various embodiments, a schematic 500 for operating cooling stack 440, and more specifically a thermo electric cooler (TEC) device, such as TEC 208, 444, is illustrated. Schematic 500 includes a power supply 502, a temperature sensor 504, a controller 506, and a thermoelectric cooler (TEC) 508. In various embodiments, TEC 508 may be an example of TEC 208 described above with respect to FIG. 2. In various embodiments, TEC 508 may be an example of TEC 444 described above with respect to FIGS. 4A-4C.

Power supply 502 may not be located on CBA 306 or within light unit 300 but be provided by aircraft 100, for example, through power connector 334. In various embodiments, CBA 306 may further include power supply 502 that may be a power regulator or power convertor, among others, the adjusts power received through power connector 334 for use with cooling stack 440. Power supply 502 provides power to temperature sensor 504, controller 506, and TEC 508.

Temperature sensor 504 is mounted to CBA 306 to monitor the temperature of CBA 306. Temperature sensor 504 may be a thermistor, a thermocouple, a resistance temperature detector, or semiconductor based integrated circuit sensor, among others. In various embodiments, more than one temperature sensor 504 may be mounted to CBA 306 to provide temperature measurements for different areas of CBA 306. Temperature sensor 504 is connected to controller 506 and provides temperature measurements to controller 506. Depending on the type of sensor used, temperature sensor 504 may provide a temperature value directly to controller 506 or temperature sensor 504 may provide a signal that indicates the temperature that controller 506 interprets.

Controller 506 is mounted to CBA 306 and controls TEC 508. Controller 506 may comprise one or more processors configured to implement various logical operations in response to execution of instructions, for example, instructions stored on a non-transitory, tangible, computer-readable medium. The one or more processors can be a general purpose processor, a microprocessor, a microcontroller, a digital signal processor (DSP), an application specific integrated circuit (ASIC), a field programmable gate array (FPGA) or other programmable logic device, discrete or transistor logic, discrete hardware components, or any combination thereof.

Controller 506 may further comprise memory to store data, executable instructions, system program instructions, and/or controller instructions to implement the control logic of controller 506.

Controller 506 monitors temperature sensor 504 and controls TEC 508 in response to measurements received from temperature sensor 504. In various embodiments, controller 506 may be configured to poll temperature sensor 504 for temperature information and convert the response received from temperature sensor 5041. In various embodiments, controller 506 may be coupled to temperature sensor 504 and continuously monitor output from temperature sensor 504. Controller 506 may then perform actions in response to the output of temperature sensor 506 including turning TEC 508 on and off. Controller 506 may send a signal to activate TEC 508 (e.g., turn on) in response to a temperature measurement from temperature sensor exceeding a threshold operating temperature. The threshold operating temperature may be about 80° C. (176° F.) to about 200° C. (392° F.), and more specifically about 110° C. (230° F.) to about 150° C. (302° F.). Controller 506 may send a signal to deactivate TEC 508 (e.g., turn off) in response to a temperature measurement below the threshold operating temperature.

In various embodiments, a heuristic may be implemented such that controller 506 activates TEC 508 in response to a temperature measurement being above an activate temperature threshold and deactivates TEC 508 in response to the temperature measurement being below a deactivate temperature threshold. For example, the activate temperature threshold may be about 80° C. (176° F.) to about 150° C. (302° F.), and more specifically, about 100° C. (212° F.) to about 120° C. (248° F.). The deactivate temperature threshold may be about 110° C. (230° F.) to about 150° C. (302° F.), and more specifically, about 120° C. (248° F.) to about 130° C. (266° F.). By using a heuristic, controller 506 may activate TEC 508 before early to begin cooling CBA 306 before the temperature exceeds the operational temperature. Controller 506 may also deactivate TEC 508 at a different temperature (e.g., as the temperature is dropping naturally) to conserve energy.

System program instructions and/or controller instructions may be loaded onto a non-transitory, tangible computer-readable medium having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 10%, within 5%, within 1%, within 0.1%, or within 0.01% of a stated value. Additionally, the terms "substantially," "about" or "approximately" as used herein represent an amount close to the stated amount that still performs a desired function or achieves a desired result. For example, the term "substantially," "about" or "approximately" may refer to an amount that is within 10% of, within 5% of, within 1% of, within 0.1% of, and within 0.01% of a stated amount or value.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above described concepts can be used alone or in combination with any or all of the other above described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. An aircraft light unit, comprising:
    a housing having a first side and an opposing second side;
    a light directly coupled to the first side of the housing;
    a circuit board assembly having a first side and a second side, the first side of the circuit board assembly directly coupled to second side of the housing;
    a spacer having a first surface and a second surface, the first surface of the spacer coupled to and physically contacting the second side of the circuit board assembly;
    a thermoelectric cooler configured to dissipate heat from the circuit board assembly, wherein the thermoelectric cooler further comprises a cold side and an opposing hot side, the cold side coupled to and physically contacting the second surface of the spacer; and
    a heat sink disposed over and physically contacting the hot side of the thermoelectric cooler and configured to dissipate heat from the thermoelectric cooler.

2. The aircraft light unit of claim 1, wherein the heat sink physically contacts the thermoelectric cooler.

3. The aircraft light unit of claim 1, wherein the spacer is made from aluminum or an aluminum alloy.

4. The aircraft light unit of claim 1, further comprising:
    an insulator coupled to the top surface of the spacer and adjacent the thermoelectric cooler.

5. The aircraft light unit of claim 4, wherein the insulator is made of at least one of ceramic, wool, or a composite material.

6. The aircraft light unit of claim 1, wherein the heat sink further comprises a plurality of fins extending toward the first side of the housing.

7. The aircraft light unit of claim 6, wherein the one or more openings are disposed between the first side and the second side of the housing.

8. The aircraft light unit of claim 7, wherein the fins of the heat sink extend partially into the one or more openings.

* * * * *